United States Patent [19]

Miyoshi et al.

[11] 4,001,859
[45] Jan. 4, 1977

[54] PHOTO COUPLER

[75] Inventors: Tadahiko Miyoshi, Hitachi; Yasutoshi Kurihara, Katsuta, both of Japan

[73] Assignee: Hitachi, Ltd., Japan

[22] Filed: Jan. 26, 1976

[21] Appl. No.: 652,307

[30] Foreign Application Priority Data

Jan. 24, 1975 Japan .................... 50-9758

[52] U.S. Cl. .................... 357/19; 357/17; 357/55; 357/68
[51] Int. Cl.² .................... H01L 31/12
[58] Field of Search ............ 357/19, 18, 55, 68, 357/17

[56] References Cited
UNITED STATES PATENTS

| | | | |
|---|---|---|---|
| 3,436,548 | 4/1969 | Biard | 250/211 |
| 3,486,029 | 12/1969 | Barrett | 250/217 |
| 3,535,532 | 10/1970 | Merryman | 250/217 |
| 3,636,358 | 1/1972 | Groshurtz | 250/211 J |
| 3,699,407 | 10/1972 | Gurtler | 317/235 R |
| 3,728,593 | 4/1973 | Coleman | 317/235 R |
| 3,748,480 | 7/1973 | Coleman | 250/211 J |
| 3,881,113 | 4/1975 | Rideout | 250/551 |
| 3,925,801 | 12/1975 | Haitz | 357/19 |
| 3,946,423 | 3/1976 | Augustine | 357/30 |

*Primary Examiner*—Martin H. Edlow
*Attorney, Agent, or Firm*—Craig & Antonelli

[57] ABSTRACT

A photo coupler comprises a multilayer insulating substrate having a cavity on a predetermined portion and a first conductive layer at the bottom of the cavity and a second conductive layer on one surface of the insulating substrate. A light emitting diode is disposed in the cavity with a substantial light emitting zone thereof being in the cavity and is electrically connected to the first conductive layer. A photo responsive device is placed above the cavity on the substrate with the photo sensitive surface of the device facing the light emitting diode and being electrically connected to the second conductive layer.

16 Claims, 3 Drawing Figures

PHOTO COUPLER

BACKGROUND OF THE INVENTION

1. Field of the Invention

The present invention relates to improvements in a photo coupler and an array thereof.

2. Description of the Prior Art

An optical coupling device including a light emitting diode and a semiconductor photo responsive device (hereinafter referred to a photo coupler) has been used for the isolation of solid state relays and transmission lines. Also, a photo coupler array consisting of a plurality of photo couplers mounted on a same substrate or a combined circuit consisting of a photo coupler and an integrated circuit are very advantageous for a logic circuit and an audio circuit.

One type of prior art structure of a photo coupler is constructed of a photo responsive device mounted on an insulating substrate and electrically connected to the conductive layer of a predetermined pattern formed on one surface of the insulating substrate for the photo responsive device.

A light emitting diode is placed above the photo responsive device with a transparent insulator disposed therebetween and is electrically connected to the conductive layer for the light emitting diode formed on one surface of the insulating substrate by a lead wire.

Another prior art structure of the photo coupler is constructed as follows. A photo responsive device and a light emitting diode are respectively mounted on both surfaces of an insulating substrate having a penetrating hole so that the light emitting diode faces the photo sensitive surface of the photo responsive device, and both the diode and the device are electrically connected to the respective conductive layer of predetermined pattern formed on both surface of the insulating substrate.

These two types of prior photo couplers have many defects as follows. The light emitted only from the one surface of the light emitting diode that faces the photo responsive device effectively arrives at the photo sensitive surface of the photo responsive device. Namely, the prior photo coupler did not fully utilize the light emitted from other surfaces of the light emitting diode, so that the light transmission efficiency of the prior photo couplers between the light emitting diode and the photo responsive device was relatively low.

When a plurality of photo couplers are situated close to each other, or a photo coupler and devices are integrated in an integrated circuit erroneous operation thereof is caused by the light emitted from the other surface of light emitting diodes. Consequently, an increase of the degree of integration of the photo coupler array has been limited.

Further, the mechanical strength of the prior photo coupler was weak, because the light emitting diode, the photo responsive device, and the electrical connections therefor were externally exposed. Still further, when the electrical connections between a light emitting diode and a conductive layer are formed with wires such as gold wires of about 50 $\mu\phi$, the burn-out of the wires during the handling at the production process reduces the reliability of the product.

For increasing the light transmission efficiency of the photo coupler, the photo responsive device must be located at the portion where the intensity of the light emitted from the diode is at a maximum. In prior art types of photo-coupler structures, the light emitted from the light emitting diodes does not necessarily impinge upon the area of the photo-responsive devices where light intensity is a maximum, because accurate positioning of the photo-responsive device just above the light emitting diode is very difficult. Mass productivity of the photo coupler is limited for this reason.

In the photo coupler array wherein the conductors for each photo coupler and other devices are closely formed, the electrostatic capacitance between the conductive layers for the light emitting diode and the photo responsive device should be as small as possible. But in the prior art structures of the photo coupler array, especially in the type where the conductive layers are formed on only one surface of the substrate, the electro-static capacitance mentioned above is necessarily large and the breakdown voltage is insufficient, which results a limited degree of integration of the photo coupler array.

SUMMARY OF THE INVENTION

One object of the present invention is to provide a photo coupler having a high light transmission efficiency.

Another object of the present invention is to provide a photo coupler having a high mechanical strength and reliability.

A further object of the present invention is to provide a photo coupler having structure suitable for a mass-production.

Still, a further object of the present invention is to provide a photo coupler with a low electrostatic capacitance between the conductive layer for the light emitting diode and the conductive layer for the photo responsive device.

Still, another object of the present invention is to provide a photo coupler array having a high degree of integration of a photo coupler.

The present invention is characterized by mounting a light emitting diode in the cavity provided on a predetermined portion of a substrate with a substantial light emitting zone of the light emitting diode being situated in the cavity.

The photo coupler of the present invention comprises a first insulating substrate provided with a first conductive layer for a light emitting diode and a second insulating substrate provided with a second conductive layer for a photo responsive device and a penetrating hole at a predetermined portion. The second insulating substrate is placed on the first insulating substrate so as to sandwitch the first conductive layer between the first and second substrates, and the light emitting diode is mounted on the first insulating substrate in the hole of the second insulating substrate whose terminals are electrically connected to the first conductive layer. The photo responsive device is mounted on the second insulating substrate and covers the hole of the second insulating substrate with the photo sensitive surface thereof facing the light emitting diode.

DETAILED DESCRIPTION

Figure 1:
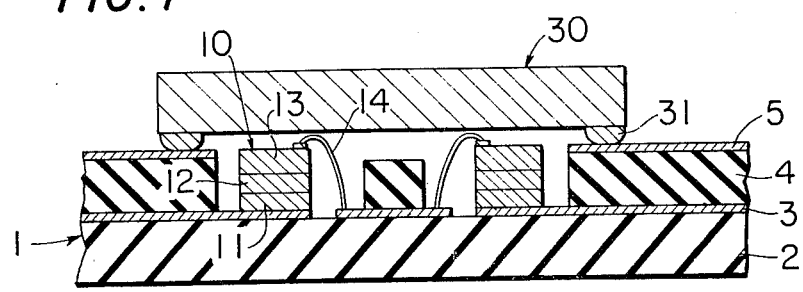
FIG. 1 is an elevational view in section of first embodiment of the present invention.

Referring to FIG. 1, showing one embodiment of the present invention, a substrate body 1 is made of a first insulating substrate 2 and a second insulating substrate 4. A first conductive layer 3 having a predetermined pattern is formed on one surface of the first insulating substrate 2. A second conductive layer 5 having a predetermined pattern is also formed on one surface of the second insulating substrate 4. The second insulating substrate 4 is placed on the first insulating substrate 2 so that the other surface of the second insulating substrate 4 faces the one surface of the first insulating substrate 2. The second insulating substrate 4 also has a penetrating hole at a predetermined portion thereof, and a cavity whose bottom corresponds to the one surface of the first insulating substrate 2 with the first conductive layer 3 is formed at a predetermined portion of the substrate body 1.

Ceramic material is preferred for the insulating substrate of the present invention. A ceramic insulating substrate has good thermal stability, thermal conductivity, and reliability for the substrate of the photo coupler of the present invention.

A ceramic green sheet is preferably used for manufacturing the substrate body 1 of the present invention. The one ceramic green sheet having a penetrating hole at a predetermined portion and a conductive layer on the surface thereof is provided for the insulating substrate 4, and the other ceramic green sheet having a conductive layer on the surface thereof is also provided for the insulating substrate 2. A desirable substrte body 1 is obtained by sintering laminated layers of the two ceramic green sheet described above. A thin conductive layer of about 200–300 $\phi$ width is formed by printing.

The manufacturing process using a ceramic green sheet for the material of the insulating substrate is suitable for a mass production because of easy handling.

A light emitting diode 10 is mounted on the bottom of the cavity. A substantial light emitting zone 12 of the light emitting diode 10 is situated in the cavity. One terminal of the light emitting diode 10 is electrically connected to the conductive layer 3 at the bottom of the cavity by a wire bonding 14 such as a gold wire. The other terminal of the light emitting diode is electrically connected through solder 11 to the conductive layer 3.

A photo responsive device 30 is mounted on the second insulating substrate 4 and covering the cavity of the substrate body 1 so that the photo responsive device 30 faces the light emitting diode 10. The photo responsive device 30 is fixed on the surface of the second insulating substrate 4 thrugh a solder 31 and the electrical connection between the photo responsive device 30 and the second conductive layer 5 on the second insulating substrate 4 is formed via solder 31.

The above described structure of the photo coupler of the present invention has the following merits.

The scattering of light emitted from the light emitting diode 10 is prevented by the internal wall to the cavity, so that the emitted light is directed only to the photo sensitive surface of the photo responsive device 30, and the quantity of the stray light is decreased. Since the light is refracted by the internal wall, the light transmission efficiency of a photo coupler is increased, and the degree of integration of the photo coupler array is increased.

The light emitting diode 10 and electrical connections therefor are encased in a space formed by the photo responsive device 30 and the first and the second insulating substrates 2 and 4, so that destruction of the light emitting diode and breakage of the electrical connections are eliminated; in other words, the mechanical strength of the photo coupler is increased.

Since the first conductive layer 3 for the light emitting diode 10 and the second conductive layer 5 for the photo responsive device 30 are separated from each other and insulated by the second insulating substrate 4, the electrostatic capacitance between conductive layers 3 and 5 is low, and the breakdown voltage between the both conductive layers 3 and 5 is increased. Consequently, erroneous operation resulting from large electrostatic capacitance between these conductive layers hardly occurs.

Further, in arranging the photo coupler array, especially the matrix type photo coupler array in which a plurality of photo couplers are placed in matrix form such as a 2 × 2 ( total of 4 ) array or a 3 × 3 ( total of 9 ) array, the arrangement of the conductors can be easily made because the light emitting diode and the light responsive devices are mounted on different substrates, respectively.

Figure 2:
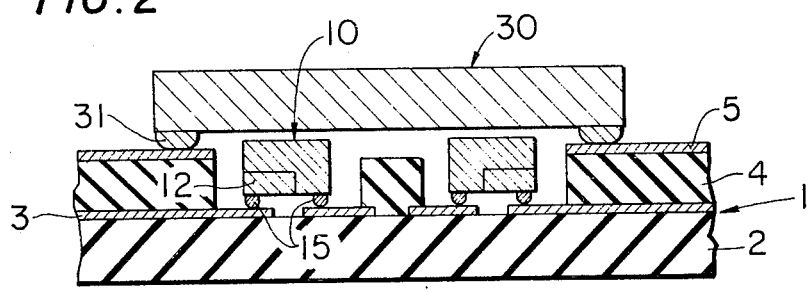
FIG. 2 is an elevational view in section of second embodiment of the present invention.

Referring next to FIG. 2, the substrate body 1 comprises a first insulating substrate 2, a first conductive layer 3, a second insulating substrate 4, and a second conductive layer 5 having the same structure as shown in FIG. 1.

In this embodiment, for a light emitting diode 10, the semiconductor diode is made of III–V compound. The light emitting zone 12 and the electrical terminals of P and N regions are formed on a main surface of the diode.

A photo coupler described above having the light emitting diode 10 has the following further merits.

Since the lead wire is not required for the electrical connection between the terminals of the light emitting diode and the conductive layer and a face down bonding method such as CCB method ( Controlled Collapsed Bonding Method ) is utilized for the bonding of the responsive device a conductive layer on the substrate the light emitting diode 10 is located very close to the photo sensitive surface of the photo responsive device 30, to thereby increase the light transmission efficiency and mechanical strength and mass-productivity of the photo coupler are further improved.

Locations of the photo responsive device 30 and the light emitting diode 10 on the substrate body 1 are easily determined according to the pattern of the conductive layers 3 and 5 on the surface of the insulating substrates 2 and 4, so that handling during the production is easy, resulting in an improvement in the mass productivity of the photo coupler.

Because the wire bonding paths are unnecessary in the embodiment shown in FIG. 2, the size of the penetrating hole slightly larger than that of the light emitting diode is sufficient so that the degree of integration of the photo coupler is increased.

The following example 1 is intended to illustrate a detailed manufacturing method of the embodiment of the present invention shown in FIG. 1.

EXAMPLE 1

An alumina green sheet was used for the first and second insulating substrates 2 and 4. A W-Ni paste film of about 50 $\mu$ thickness was printed on the one surface of the alumina green sheets with a predetermined pattern so as to form conductive layers 3 and 5. Two penetrating holes of about 2 mmφ were bored at predetermined portions of the alumina green sheet for the second insulating substrate 4.

The two alumina green sheets were bonded by pressing and thereafter sintered. The thickness of each sintered alumina green sheet was about 0.8 mm for the first insulating substrate 2 and about 0.3 mm for the second insulating substrate 4.

The exposed portion of the conductive layers 3 and 5 outside the substrate 1 was coated with Au.

An Si doped GaAs infrared light emitting diode of about $0.5 \times 0.5 \times 0.3$ mm$^3$ was used for the light emitting diode 10. The entire surface of the P region of the light emitting diode 10 was previously coated with successive layers of Au-Zn and Au-Ge by evaporation, and an electrical terminal portion of about 100 μφ on the surface of N region of the diode 10 was also previously coated with successive layers of Au-Ge-Ni and Au by evaporation. These coating layers form electrodes for the light emitting diode.

Each of the light emitting diodes was mounted in each of the cavities formed on the substrate body 1, and thereafter heat-treated at 450° C so as to bond the surface of the P region of the light emitting diode 10 with the first conductive layer 3. The electrode formed on the surface of the N region of the light emitting diode 10 was electrically connected to the first conductive layer 3 through a lead wire such as a gold wire of about 25 μφ.

A silicon device of about $5 \times 5 \times 0.3$ mm$^3$ in which two photo transistors are formed was adopted for the photo responsive device 30. The electrode portions of the device were previously coated with successive layers of Al, Cr, Cu, Au, and solder. The Si-device 30 was bonded on the second conductive layer 5 on the second insulating substrate 4 by using the CCB method with the photo sensitive surface of the photo transistor being located just above the light emitting diode 10 in the cavity.

Figure 3:
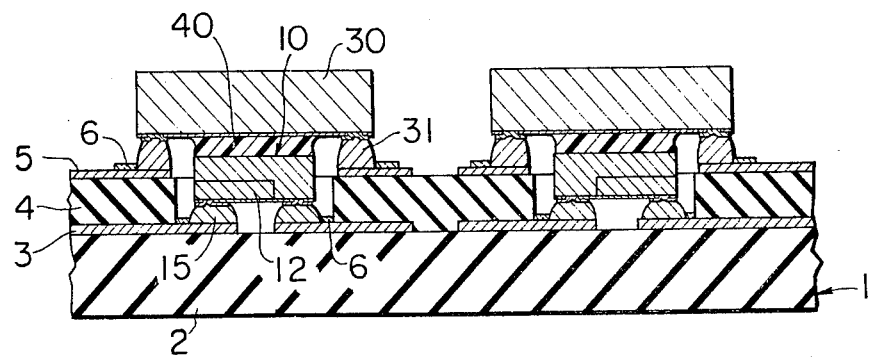
FIG. 3 is an elevational view in section of third embodiment of the present invention.

Now, referring to FIG. 3, there is shown still another embodiment of the present invention.

A transparent medium 40 such as a silicon resin is filled in the space between the light emitting diode 10 and the photo sensitive surface of the photo responsive device 30. Other structural features of this embodiment are the same as those shown in FIGS. 1 and 2 so explanation of the structural features will be omitted.

The transparent medium has a higher refractive index than that of air. The incident light rays directed to the boundary between the transparent medium 30 and the air emitted from the light emitting diode 10 are reflected inside of the medium 40 and, therefore, the light rays were collected onto the light sensitive surface of the photo responsive device 30, so that the stray light which is directed onto the portion other than the photo sensitive surface of the photo responsive device 30 was decreased. The light transmission efficiency of the photo coupler shown in FIG. 3 was increased about 70%.

The following example 2 is intended to illustrate detailed manufacturing method of the embodiment shown in FIG. 3.

EXAMPLE 2

An alumina green sheet was used for the first and second insulating substrates 2 and 4. Penetrating holes of about $0.5 \times 0.5$ mm$^2$ diameter were bored at predetermined portions of the alumina green sheet for the second insulating substrate 4.

The conductive layers having a predetermined pattern were formed on the one surface of the each alumina green sheets by the same method explained in connection with Example 1.

Both alumina green sheets were bonded by pressing and were thereafter sintered.

The thickness of the sintered alumina green sheets was about 0.8 mm for the first insulating substrate 2 and about 0.3 mm for the second insulating substrate 4.

The substrate body 1 obtained was dipped into melted solder so as to coat the exposed conductive layer 3 and 5 with a thin solder layer.

As the light emitting diode 10, a silicon doped GaAs diode of about $0.4 \times 0.4 \times 0.2$ mm$^2$ was used. A P type GaAs layer was prepared selectively in an Si dope N type GaAs substrate of the diode. The electrodes were formed previously on the P region an N region of the light emitting diode respectively. The electrode on the P region was formed with a multi-coating layer of Al, Cr, Cu, Au, and solder, the electrode on the N region was formed with a multi-coating layer of Au-Ge-Ni, Al, Cr, Cu, Au and solder.

As the photo responsive device 30, a photo SCR of about $0.7 \times 0.7 \times 0.2$ mm$^3$ in size was used. Electrodes were previously formed on a predetermined portion of the photo SCR by evaporation of Al, Cr, Cu, Au and solder.

Each of the light emitting diodes 10 was mounted in each of the holes of the second insulating substrate 4, respectively; thereafter a photo SCR 30 was mounted on the second insulating substrate 4 so that the photo sensitive surface of the photo SCR 30 faces the light emitting diode 10. Then, the entire photo coupler array was heated at a temperature about 330° C so that the solder layer of the electrodes of the light emitting diode 10 and photo SCR 30 and the conductive layers 3 and 5 on the insulating substrate 2 and 4 were melted and bonded to each other.

Finally, silicon resin EJC-245 (produced by the General Electric Co.) filled the space between the light emitting diode 10 and the photo sensitive surface of the photo SCR 30 and was cured by heat treatment at 150° C for about 1 hour.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. A photo coupler comprising:
   a. a first insulating substrate provided with a first conductive layer having a predetermined pattern on one surface thereof;
   b. a second insulating substrate provided with a second conductive layer having a predetermined pattern on one surface thereof and a hole penetrating therethrough at a predetermined portion, said second insulating substrate being placed on said first insulating substrate so that the other surface of said second insulating substrate faces the one surface of siad first insulating substrate;

c. a light emitting diode mounted on said first insulating substrate in the hole of said second insulating substrate, one terminal of said light emitting diode being electrically connected with the first conductive layer on said first insulating substrate; and d. a photo responsive device mounted on said second insulating substrate and covering the hole of said second insulating substrate so that the light sensitive surface of said photo responsive device faces said light emitting diode.

2. A photo coupler according to claim 1, wherein a substantial light emitting zone of said light emitting diode is situated in the hole of said second insulating substrate.

3. A photo coupler according to claim 1, wherein said photo responsive device is fixed on the one surface of said second insulating substrate through solder material and the electrical connection between said photo responsive device and the second conductive layer on said second insulating substrate is formed through solder.

4. A photo coupler according to claim 1, wherein said light emitting diode is fixed on the one surface of said first insulating substrate through solder and the electrical connection between said light emitting diode and the first conductive layer on said first insulating substrate is formed through solder.

5. A photo coupler according to claim 1, wherein the other terminal of said light emitting diode is electrically connected to the first conductive layer on said first insulating substrate by a wire lead.

6. A photo coupler according to claim 1, further comprising a light transmitting medium filling the region between said light emitting diode and said photo responsive device.

7. A photo coupler according to claim 1, wherein each of said first and second insulating substrates consists of ceramic material.

8. A photo coupler according to claim 6, wherein said light transmitting medium consists of silicon resin.

9. A photo coupler array comprising:

a. a first insulating substrate provided with a first conductive layer having a predetermined pattern on one surface thereof;

b. a second insulating substrate provided with a second conductive layer having a predetermined pattern on one surface thereof and a plurality of holes penetrating therethrough at predetermined portions thereof, said second insulating substrate being placed on said first insulating substrate so that the other surface of the second insulating substrate faces the one surface of said first insulating substrate;

c. a plurality of light emitting diodes mounted on said first insulating substrate in the respective holes of said second insulating substrate, one of the terminals of said respective light emitting diodes being electrically connected with the first conductive layer on said first insulating substrate; and d. a photo responsive device mounted on said second insulating substrate and covering the respective holes of said second insulating substrate so that the light sensitive surface of said photo responsive device faces said respective light emitting diodes.

10. A photo coupler array according to claim 9, wherein a substantial light emitting zone of each of said light emitting diodes is situated in each respective hole of said second insulating substrate.

11. A photo coupler array according to claim 9, wherein said photo responsive device is fixed on the one surface of said second insulating substrate through solder and the electrical connection between said photo responsive device and the second conductive layer on said second insulating substrate is formed through solder.

12. A photo coupler array according to claim 9, wherein said plurality of light emitting diodes are fixed on the one surface of said first insulating substrate through solder and the electrical connections between said light emitting diodes and the first conductive layer on said first insulating substrate on formed through solder.

13. A photo coupler array according to claim 9, wherein the other terminals of said plurality of light emitting diodes are electrically connected to the first conductive layer of said first insulating substrate by a wire lead.

14. A photo coupler array according to claim 9, further comprising a light transmitting medium filling the regions between said light emitting diodes and said photo responsive devices.

15. A photo coupler array according to claim 9, wherein each of said first and second insulating substrates consists of ceramic material.

16. A photo coupler array according to claim 14, wherein said light transmitting medium consists of silicon resin.

* * * * *